United States Patent
Ho et al.

(10) Patent No.: US 7,622,381 B2
(45) Date of Patent: Nov. 24, 2009

(54) SEMICONDUCTOR STRUCTURE AND THE FORMING METHOD THEREOF

(75) Inventors: Jar-Ming Ho, Taipei (TW); Shian-Jyh Lin, Taipei (TW); Ming-Yuan Huang, Yunlin (TW)

(73) Assignee: Nanya Technology Corp., Taoyuan (TW)

( * ) Notice: Subject to any disclaimer, the term of this patent is extended or adjusted under 35 U.S.C. 154(b) by 268 days.

(21) Appl. No.: 11/829,371

(22) Filed: Jul. 27, 2007

(65) Prior Publication Data

US 2008/0217779 A1 Sep. 11, 2008

(30) Foreign Application Priority Data

Mar. 6, 2007 (TW) .............................. 96107628 A

(51) Int. Cl.
H01L 21/4763 (2006.01)
H01L 21/44 (2006.01)

(52) U.S. Cl. ........................ 438/630; 438/629; 438/675; 438/643

(58) Field of Classification Search ................. 438/630, 438/647, 655, 657, 386, 399, 244, 243, 675
See application file for complete search history.

(56) References Cited

U.S. PATENT DOCUMENTS

| | | | |
|---|---|---|---|
| 5,460,999 A * | 10/1995 | Hong et al. ................. | 438/397 |
| 5,656,861 A * | 8/1997 | Godinho et al. ............. | 257/758 |
| 5,716,862 A * | 2/1998 | Ahmad et al. ............... | 438/303 |
| 5,843,820 A * | 12/1998 | Lu .............................. | 438/243 |
| 6,077,742 A * | 6/2000 | Chen et al. ................... | 438/255 |
| 6,236,079 B1 * | 5/2001 | Nitayama et al. ........... | 257/306 |
| 6,251,719 B1 * | 6/2001 | Wang ......................... | 438/238 |
| 6,287,913 B1 * | 9/2001 | Agnello et al. .............. | 438/241 |
| 6,611,019 B2 * | 8/2003 | Rudeck ....................... | 257/315 |
| 7,332,388 B2 * | 2/2008 | Trivedi et al. ............... | 438/199 |
| 2007/0122945 A1 * | 5/2007 | Kim ........................... | 438/132 |

* cited by examiner

*Primary Examiner*—Chuong A. Luu
(74) *Attorney, Agent, or Firm*—Ingrassia Fisher & Lorenz, P.C.

(57) ABSTRACT

The present invention provides a semiconductor structure and the forming method thereof. The structure includes a substrate having a plurality of stacks; a conformal layer on the substrate and a portion of sidewalls of the plurality of the stacks; and a plurality of plugs between the plurality of stacks. In addition, the present invention also provides a method of forming the semiconductor structure, comprising steps of providing a substrate; forming a plurality of stacks on the substrate; forming a conformal layer on the stacks and on the substrate; removing a portion of the conformal layer to expose a sidewall and a top surface of the plurality of stacks; and forming a plurality of plugs between the stacks.

9 Claims, 5 Drawing Sheets

SEMICONDUCTOR STRUCTURE AND THE FORMING METHOD THEREOF

RELATED APPLICATION

This application claims the right of priority based on Taiwan Patent Application No. 096107628 entitled "A SEMICONDUCTOR STRUCTURE AND THE FORMING METHOD THEREOF", filed on Mar. 6, 2007, which is incorporated herein by reference and assigned to the assignee herein.

FIELD OF THE INVENTION

The present invention relates to a semiconductor structure, and more particularly to a method of forming the semiconductor structure capable of preventing a plug integrated therein from cracking.

BACKGROUND OF THE INVENTION

Dynamic random access memories (DRAMs) gradually become very important electronic devices. DRAMs generally include a great number of memory cells integrated in array regions for storing data. DRAMs further include peripheral regions for peripheral control circuits. Each of memory cells and the peripheral control circuits usually includes metal-oxide-semiconductor (MOS) transistors and other electronic devices such as series capacitors. In general, capacitors electrically connect with bit lines while control gates of MOS transistors electrically connect with word lines. In such an arrangement, each of the memory cells can be addressed. In order to electrically interconnect these electronic devices, a plurality of contact windows are formed between various layers, and then subsequently filled with conductive materials to serve as a part of interconnections among these electronic devices so as to achieve the functionality of the MOS transistors.

As the DRAM process advances to the scale of 100 nanometer, a plug is usually formed by forming a nitride spacer (e.g. silicon nitride spacer) on the sidewall of the contact window and followed by filling the contact window with undoped polysilicon to form a sacrificial plug. However, when the undoped polysilicon is removed by etching, the height of the spacer is difficult to control because the selectivity of the undoped polysilicon with respect to the nitride spacer is relatively low, that adversely increases the coupling capacitance between the word line and the bit line. Furthermore, as the distance between contact windows continuously decreases due to the shrinkage of the devices, the aspect ratio of the contact window gradually increases. As a result, the plugs disposed within the contact windows will crack easily such that the integrity and the reliability of the semiconductor device are unable to maintain. Therefore, it would be desirable to provide an improved method to eliminate the drawbacks of the conventional semiconductor devices.

SUMMARY OF THE INVENTION

One aspect of the present invention is to reduce the aspect ratio of the contact window so as to prevent the plug from cracking.

Another aspect of the present invention is to provide a semiconductor device with improved gap-filling capability during manufacturing processes.

In one embodiment, the present invention provides a semiconductor structure including a substrate having a plurality of stacks; a conformal layer on the substrate and a portion of sidewalls of the plurality of the stacks, wherein the top surfaces and the other portion of sidewalls of the plurality of stacks are exposed; and a plurality of plugs between the plurality of stacks. In addition, the present invention also provides a method for forming the semiconductor structure. The method includes steps of providing a substrate; forming a plurality of stacks on the substrate; forming a conformal layer on the plurality of stacks and on the substrate; removing a portion of the conformal layer to expose a portion of sidewalls and top surfaces of the plurality of stacks; and forming a plurality of plugs between the plurality of stacks.

DETAILED DESCRIPTION

Figure 1:
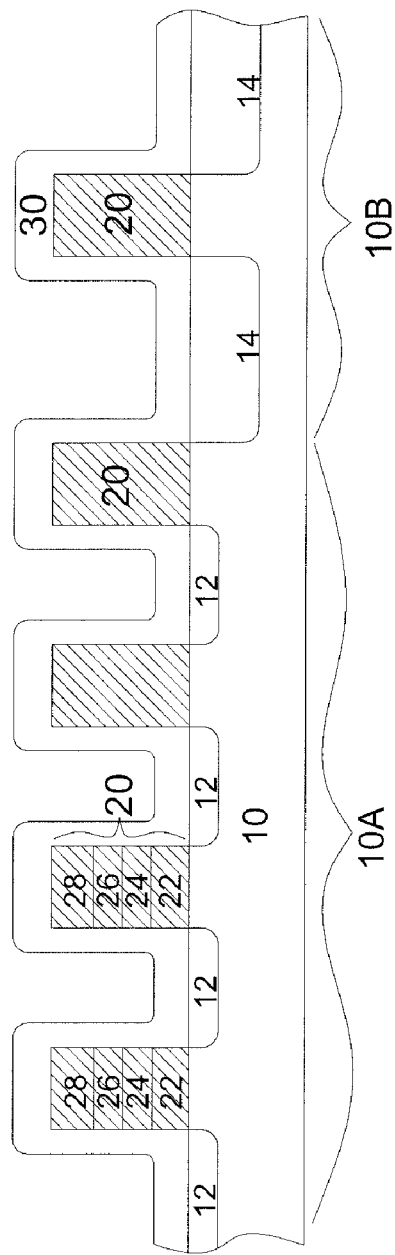
FIG. 1 is a cross-sectional view illustrating a conformal layer formed on a plurality of stacks on a substrate in accordance with the present invention.

The preferred embodiments of the present invention will now be described in greater details by referring to the drawings that accompany the present application. It should be noted that the features illustrated in the drawings are not necessarily drawn to scale. Descriptions of well-known components, materials, and process techniques are omitted so as not to unnecessarily obscure the embodiments of the invention.

FIGS. 1 to 8 are cross-sectional views illustrating the steps of forming a semiconductor structure in accordance with one embodiment of the present invention. First of all, as shown in FIG. 1, a semiconductor substrate 10 having a first region 10A and a second region 10B is provided. The first region 10A is defined as a memory array region, while the second region 10B is defined as a logic device region. The semiconductor substrate 10 may be a silicon substrate or a substrate having other semiconductor devices therein.

A plurality of sources or drains 12 are formed in the first region 10A of the substrate 10 by a traditional ion implant process. Additionally, a plurality of isolations 14 are formed in the second region 10B of the substrate 10. A plurality of stacks 20 are formed on the substrate 10, and each stack 20 may include a gate dielectric layer 22 on the substrate 10, a polysilicon layer 24 on the gate dielectric layer 22, a metal silicide layer 26 on the polysilicon layer 24, and a cap layer 28 on the metal silicide layer 26. The exemplary material of the metal silicide layer 26 can be tungsten silicide (WSi), and the exemplary material of the cap layer 28 can be silicon nitride. Then, a conformal layer 30 is formed over the plurality of stacks 20 and the substrate 10. For example, the conformal layer 30 can be an oxide layer, such as silicon dioxide ($SiO_2$).

Figure 2:
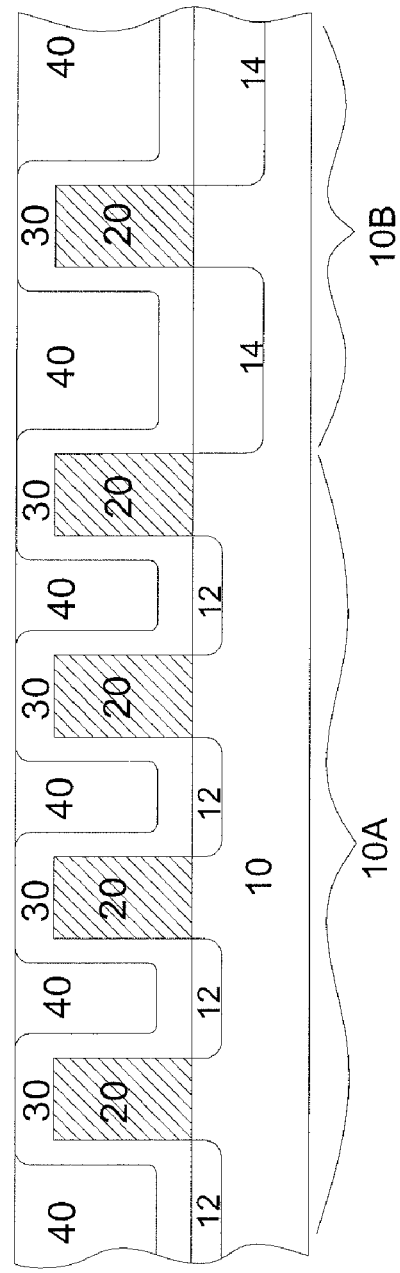
FIG. 2 is a cross-sectional view illustrating a first polysilicon layer formed on the structure of FIG. 1 in accordance with the present invention.

As shown in FIG. 2, a first polysilicon layer 40 is then deposited to cover the structure as shown in FIG. 1. The first polysilicon layer 40 can be an undoped polysilicon layer, which is formed by a conventional chemical vapor deposition process. Next, a planarization step is applied to the first polysilicon layer 40 until a top surface of the conformal layer is exposed. The planarization step may be performed by chemical mechanical polishing.

Figure 3:
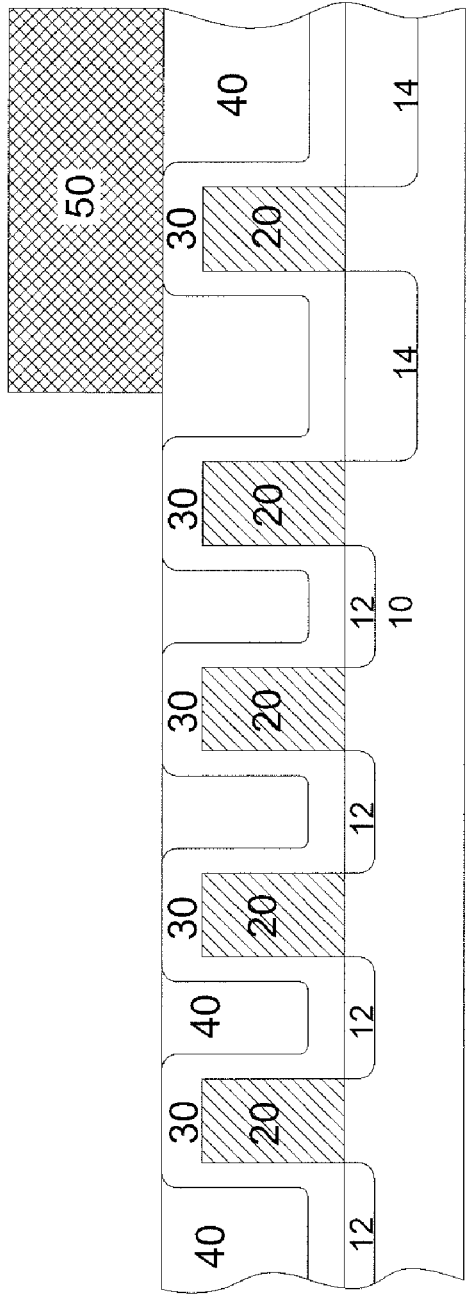
FIG. 3 is a cross-sectional view illustrating a first photoresist layer formed on the structure of FIG. 2 in accordance with the present invention.
Figure 4:
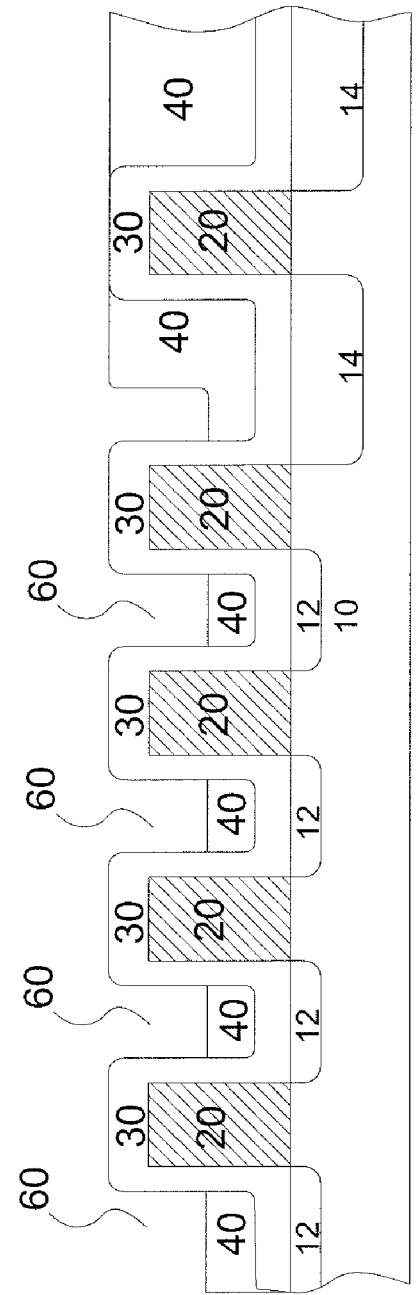
FIG. 4 is a cross-sectional view illustrating the exposed conformal layer on a portion of sidewalls and top surfaces in accordance with the present invention.

As shown in FIG. 3, a first photoresist layer 50 is then formed on the second region 10B of the substrate 10. Then, as shown in FIG. 4, a first etching step is applied to remove a portion of the first polysilicon 40 uncovered by the first photoresist layer 50 to a depth, such that openings 60 between the stacks 20 are formed in the first region 10A of the substrate 10. The depth of the opening 60 is preferably smaller than the thickness of the cap layer 28. The first photoresist layer 50 is then stripped. It should be noted that, in order to reduce the coupling capacitance between the word line and the bit line, the conformal layer 30 is preferably an oxide layer since the etching selectivity of undoped polysilicon with respect to oxide is higher than that of undoped polysilicon to nitride.

Figure 5:
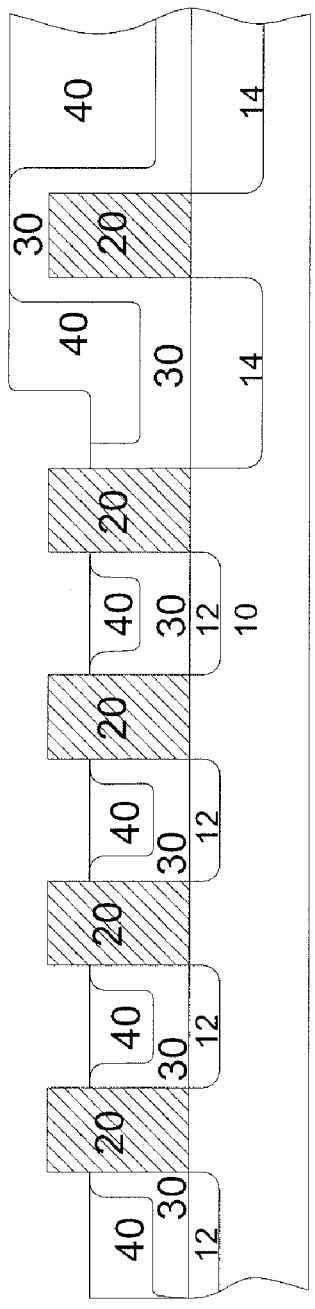
FIG. 5 is a cross-sectional view illustrating the exposed sidewalls and the top surfaces after removing a portion of the conformal layer in accordance with the present invention.

Please note that the depth of the opening 60 as shown in FIG. 4 is adjustable by controlling the first etching step. Therefore, the portion of the conformal layer 30 to be exposed depends on the depth of the opening 60. As shown in FIG. 5, the exposed conformal layer 30 on upper portions of the sidewalls and the top surfaces of the plurality of stacks 20 above the remained first polysilicon layer 40 is removed, so as to expose the upper portion of the sidewalls and the top surfaces of the plurality of stacks. The exposed conformal layer 30 may be removed by a wet etch process using, for example, diluted hydrogen fluoride (DHF) or other chemical solutions as appropriate. Since the etching selectivity between the first polysilicon layer 40 and the conformal layer 30 is relatively high, the first polysilicon layer 40 is substantially not affected when removing the conformal layer 30.

Figure 6:
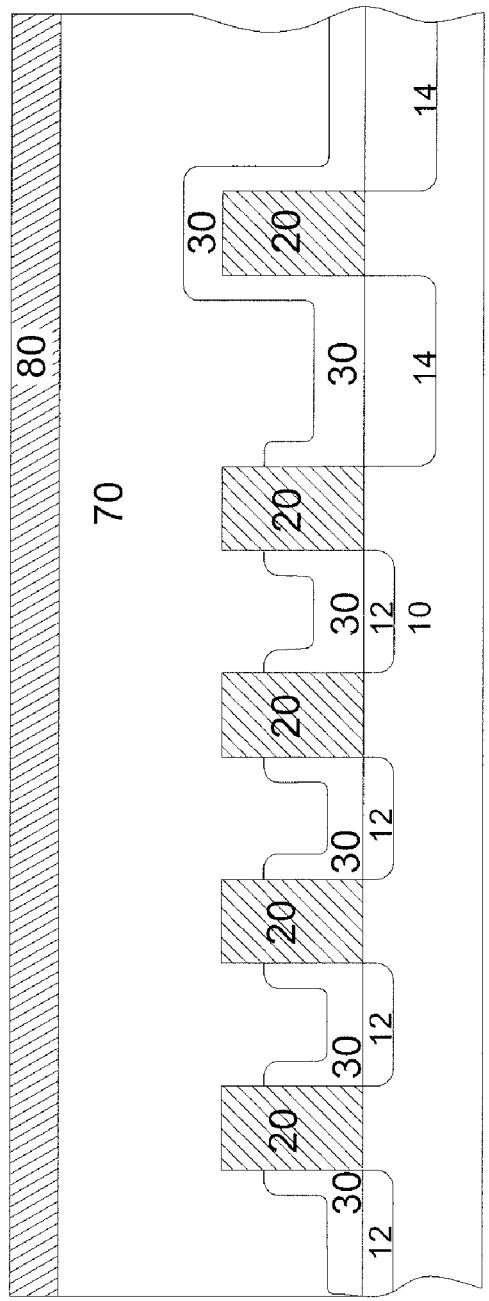
FIG. 6 is a cross-sectional view illustrating a second polysilicon layer and a barrier layer sequentially formed on the structure of FIG. 5 in accordance with the present invention.

As shown in FIG. 6, a second polysilicon layer 70 is then deposited to cover the structure as shown in FIG. 5. In an exemplary embodiment, both the second polysilicon layer 70 and the first polysilicon layer 40 are undoped polysilicon, so that only the second polysilicon layer 70 is shown in FIG. 6. The second polysilicon 70 can be formed by a low-pressure chemical vapor deposition (LPCVD) process. After the second polysilicon 70 is formed, a barrier layer 80 is optionally deposited on the second polysilicon layer 70. The barrier layer 80 may include silicon oxide, silicon nitride, or other suitable materials. It is noted that a second planarization step (not shown) may be optionally applied after the second polysilicon layer 70 is formed. The second planarization step is intended to planarize the surface of the second polysilicon layer 70 so as to facilitate the formation of the barrier layer 80 on the second polysilicon layer 70.

Figure 7:
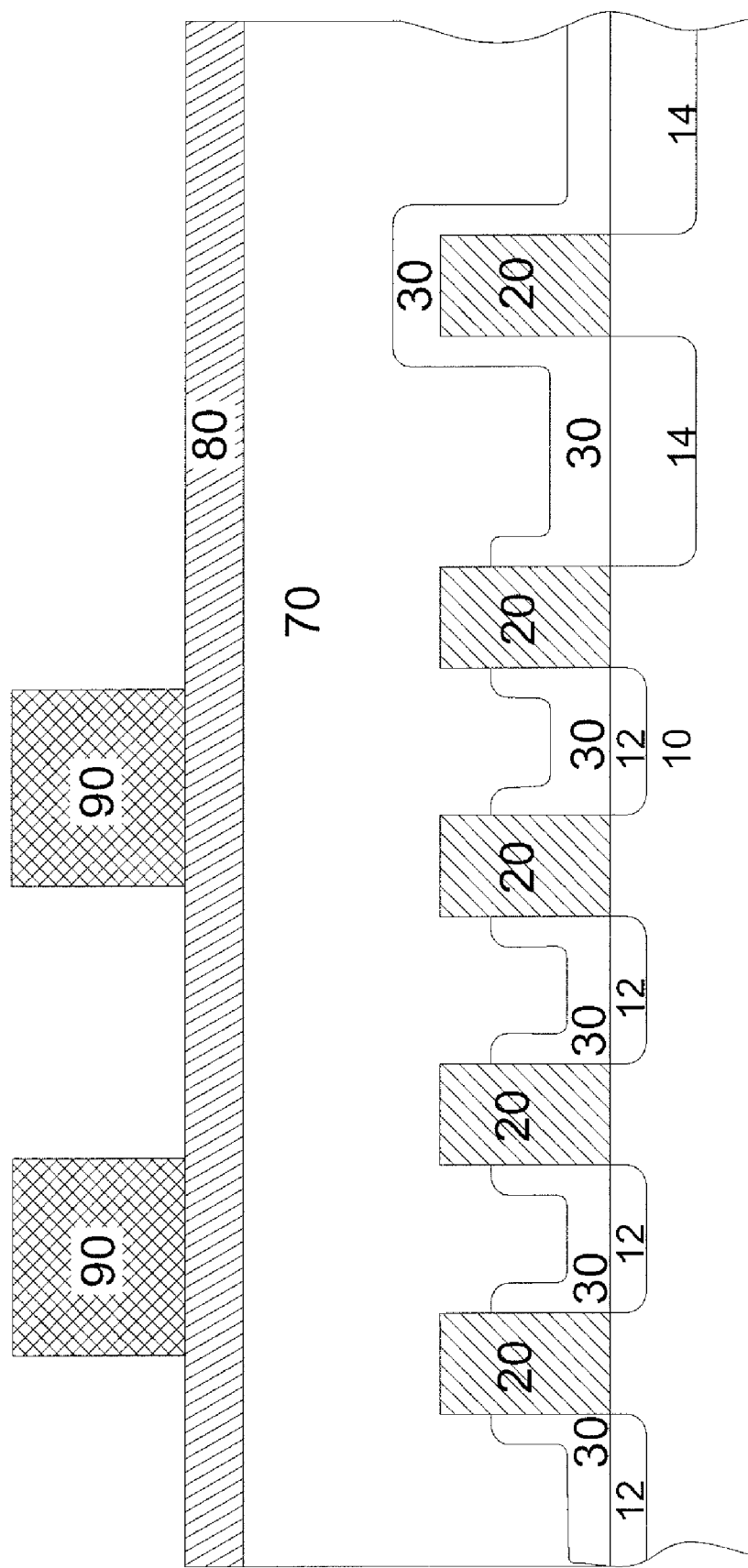
FIG. 7 is a cross-sectional view illustrating a second photoresist layer formed on the structure of FIG. 6 in accordance with the present invention.
Figure 8:
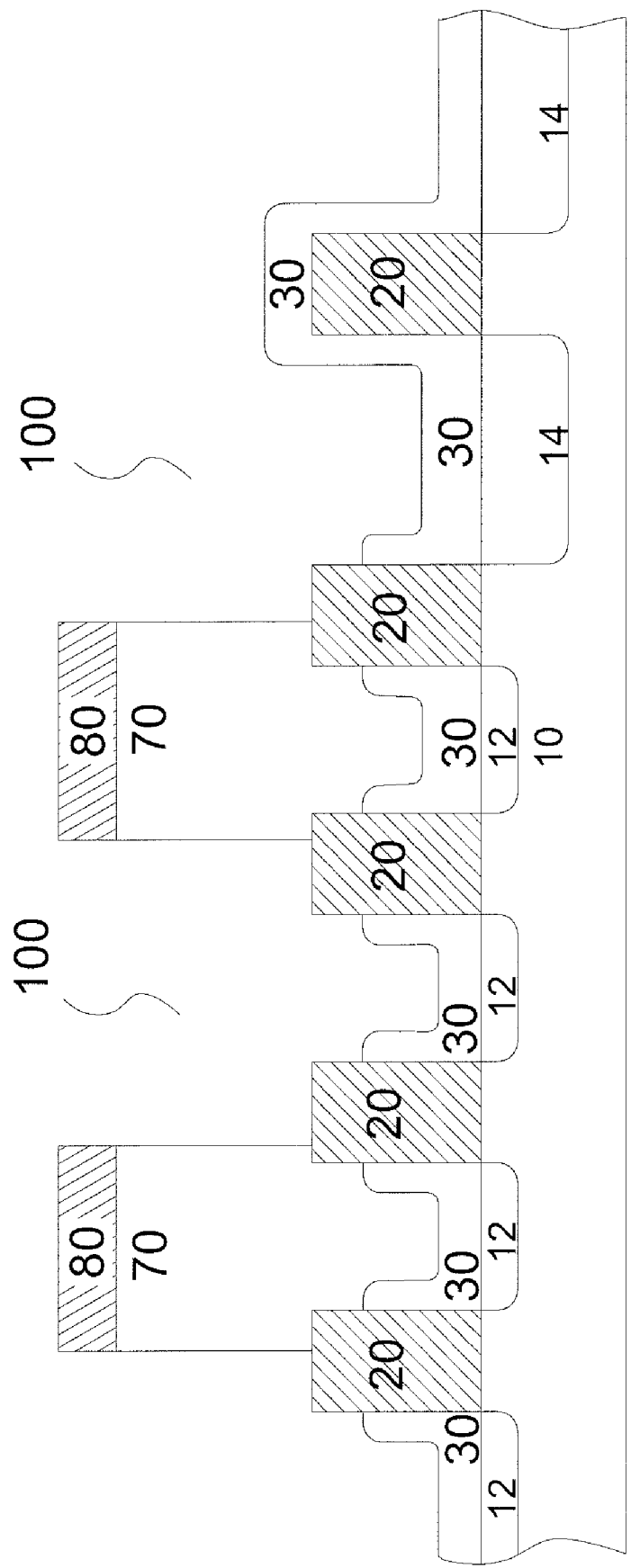
FIG. 8 is a cross-sectional view illustrating a plurality of plugs formed between the plurality of stacks after etching the structure of FIG. 7 in accordance with the present invention.

As shown in FIG. 7, a second photoresist layer 90 is then formed on the barrier layer 80 corresponding to the first region 10A of the substrate 10. The second photoresist layer 90 defines contact windows for bit lines. Then, using the second photoresist layer 90 as a mask, another etch step is performed to remove the barrier layer 80 and the second polysilicon layer 70 including the first polysilicon layer 40 (not shown), such that a plurality of plugs are formed on the first region 10A of the substrate 10. The plug includes the barrier layer 80, the second polysilicon layer 70, and the first polysilicon layer 40 (not shown). There are a plurality of openings 100 formed between the plurality of the plugs, as shown in FIG. 8.

In view of the aforementioned steps for forming the semiconductor structure in accordance with the present invention, it should be understood that the dimension of contact window for bit line is increased. Accordingly, the crack of the plug caused by the unduly higher aspect ratio in the prior art can be prevented, and the gap filling capability can be improved. The structure as shown in FIG. 8 may be subsequently filled with any liners for bit lines, dielectric materials such as BPSG (borophososilicate glass), or any conductive layers.

Although specific embodiments have been illustrated and described, it will be obvious to those skilled in the art that various modifications may be made without departing from what is intended to be limited solely by the appended claims.

The invention claimed is:

1. A method of forming a semiconductor structure, forming a plurality of plugs between the stacks comprising:
   providing a substrate;
   forming a plurality of stacks on the substrate;
   forming a conformal layer over the plurality of stacks and the substrate;
   forming a first polysilicon layer over the conformal layer;
   removing a portion of the first polysilicon layer and a portion of the conformal layer to expose a sidewall and a top surface of the plurality of stacks;
   forming a second polysilicon layer over the substrate;
   forming a barrier layer on the second polysilicon layer; and
   removing a portion of the barrier layer and the second polysilicon layer to form a plurality of plugs between the plurality of stacks.

2. The method of forming a semiconductor structure as claim 1, wherein the substrate comprises a plurality of sources or drains.

3. The method of forming a semiconductor structure as claim 1, wherein the plurality of stacks comprises a gate dielectric layer, a polysilicon layer, a metal silicide layer, and a cap layer respectively stacked from bottom to top.

4. The method of forming a semiconductor structure as claim 3, wherein the metal silicide layer is made of tungsten silicide (WSi).

5. The method of forming a semiconductor structure as claim 1, wherein the conformal layer is an oxide layer.

6. The method of forming a semiconductor structure as claim 1, further comprising performing a planarization step to remove a portion of the first polysilicon layer and expose a top surface of the conformal layer.

7. The method of forming a semiconductor structure as claim 6, wherein the planarization step is by chemical mechanical polishing.

8. The method of forming a semiconductor structure as claim 1, wherein the step of removing the portion of the conformal layer is by using DHF solution.

9. The method of forming a semiconductor structure as claim 1, wherein the step of forming the second polysilicon layer is by using low pressure chemical vapor deposition.

* * * * *